United States Patent
Kashima et al.

(10) Patent No.: US 9,911,752 B2
(45) Date of Patent: Mar. 6, 2018

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventors: Takayuki Kashima, Yokkaichi (JP);
Masahiro Fukuda, Kuwana (JP);
Takashi Hirotani, Yokohama (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 15/225,275

(22) Filed: Aug. 1, 2016

(65) Prior Publication Data
US 2017/0271355 A1    Sep. 21, 2017

Related U.S. Application Data

(60) Provisional application No. 62/309,175, filed on Mar. 16, 2016.

(51) Int. Cl.
| | |
|---|---|
| *H01L 27/115* | (2017.01) |
| *H01L 29/788* | (2006.01) |
| *H01L 29/792* | (2006.01) |
| *H01L 21/04* | (2006.01) |
| *H01L 27/11582* | (2017.01) |
| *H01L 21/02* | (2006.01) |
| *H01L 21/306* | (2006.01) |
| *H01L 21/308* | (2006.01) |

(52) U.S. Cl.
CPC .... *H01L 27/11582* (2013.01); *H01L 21/0217* (2013.01); *H01L 21/02164* (2013.01); *H01L 21/3083* (2013.01); *H01L 21/30604* (2013.01)

(58) Field of Classification Search
CPC .......... H01L 27/11582; H01L 21/0217; H01L 21/3083; H01L 21/30604; H01L 21/02164
USPC ............... 257/211, 314, 316, 324, E21.422, 257/E23.141, E29.3; 438/261, 269, 588
See application file for complete search history.

(56) References Cited

U.S. PATENT DOCUMENTS

| | | | |
|---|---|---|---|
| 7,081,652 B2 | 7/2006 | Oishi | |
| 8,008,732 B2 | 8/2011 | Kiyotoshi et al. | |
| 9,379,134 B2 * | 6/2016 | Lee | H01L 27/1157 |

(Continued)

FOREIGN PATENT DOCUMENTS

| | | |
|---|---|---|
| JP | 2005-328033 | 11/2005 |
| JP | 2008-78404 | 4/2008 |

*Primary Examiner* — Dao H Nguyen
(74) *Attorney, Agent, or Firm* — Oblon, McClelland, Maier & Neustadt, L.L.P.

(57) ABSTRACT

According to one embodiment, a semiconductor memory device includes a semiconductor substrate, a stacked body provided on the semiconductor substrate and including a plurality of electrode films being disposed to be separated from each other along a vertical direction, a first semiconductor member provided inside the stacked body and contacting the semiconductor substrate, a second semiconductor member provided on the first semiconductor member inside the stacked body, contacting the first semiconductor member and extending in the vertical direction, and an insulating film provided between the second semiconductor member and the electrode films. A configuration of a contact surface between the first semiconductor member and the second semiconductor member is convex downward.

8 Claims, 16 Drawing Sheets

(56) References Cited

U.S. PATENT DOCUMENTS

| | | | | |
|---|---|---|---|---|
| 2014/0070302 A1* | 3/2014 | Yoo | ................... | H01L 27/1157 257/324 |
| 2014/0227841 A1* | 8/2014 | Lee | ................... | H01L 27/1157 438/268 |
| 2015/0050803 A1* | 2/2015 | Lee | ................. | H01L 27/11582 438/588 |

* cited by examiner

SEMICONDUCTOR MEMORY DEVICE AND METHOD FOR MANUFACTURING SAME

CROSS-REFERENCE TO RELATED APPLICATION

This application is based upon and claims the benefit of priority from U.S. Provisional Patent Application 62/309,175, filed on Mar. 16, 2016; the entire contents of which are incorporated herein by reference.

FIELD

Embodiments relate to a semiconductor memory device and a method for manufacturing the same.

BACKGROUND

In recent years, a stacked type semiconductor memory device has been proposed in which memory cells are integrated three-dimensionally. In such a stacked type semiconductor memory device, a stacked body in which electrode films and insulating films are stacked alternately is provided on a semiconductor substrate; and a semiconductor pillar that pierces the stacked body is provided. Also, memory cells are formed at each intersection between the semiconductor pillar and the electrode film. In such a semiconductor memory device, it is an issue to maintain stability in operation even in the case where the structure shrinks.

DETAILED DESCRIPTION

A semiconductor memory device according to one embodiment includes a semiconductor substrate, a stacked body provided on the semiconductor substrate and including a plurality of electrode films that are disposed to be separated from each other along a vertical direction, a first semiconductor member provided inside the stacked body and contacting the semiconductor substrate, a second semiconductor member provided on the first semiconductor member inside the stacked body, contacting the first semiconductor member and extending in the vertical direction, and an insulating film provided between the second semiconductor member and the electrode films. The configuration of a contact surface between the first semiconductor member and the second semiconductor member is convex downward

First Embodiment

First, a first embodiment will be described.

Figure 1:
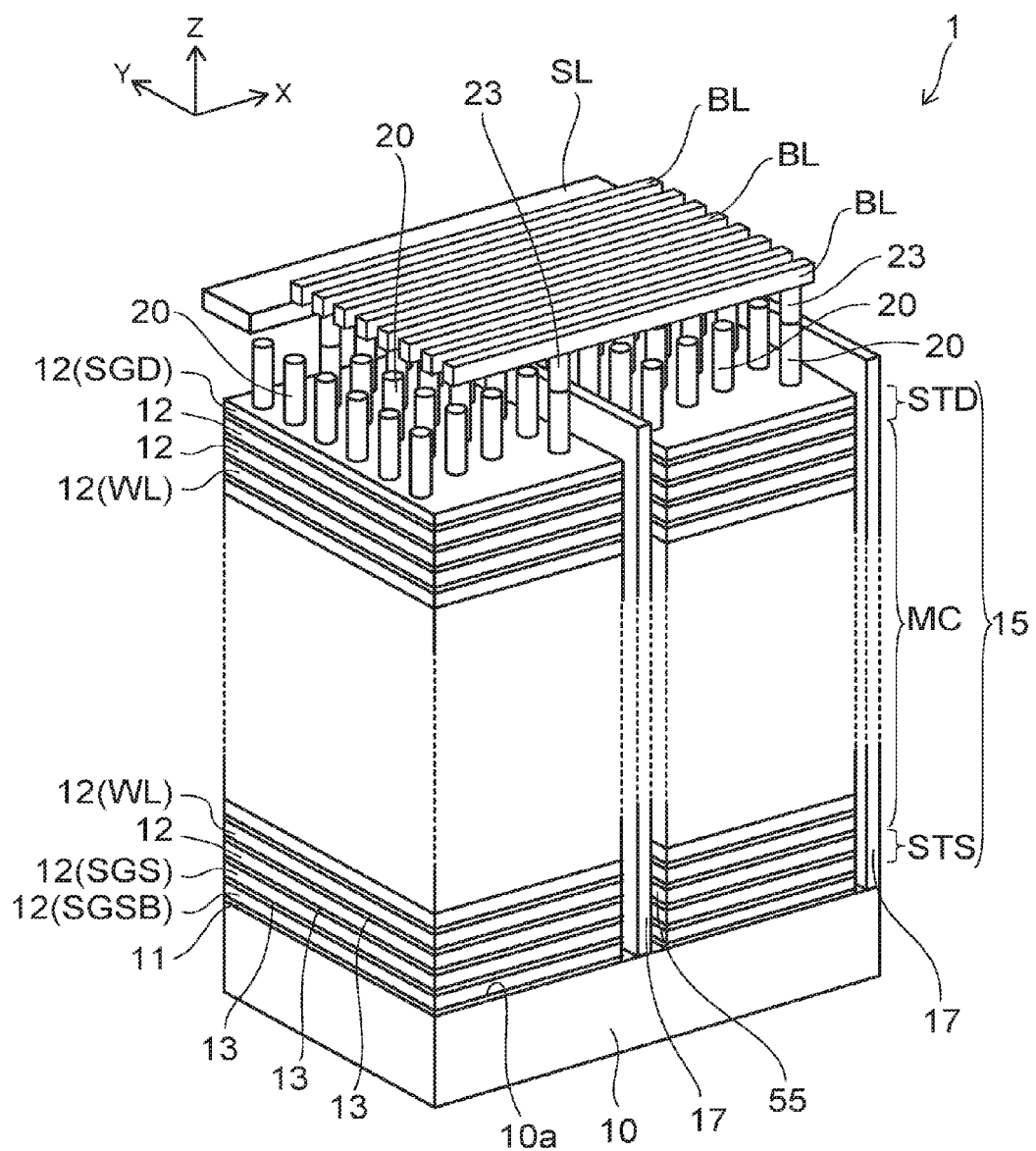
FIG. 1 is a perspective view showing a semiconductor memory device according to a first embodiment.

FIG. 1 is a perspective view showing a semiconductor memory device according to the embodiment.

Figure 2:
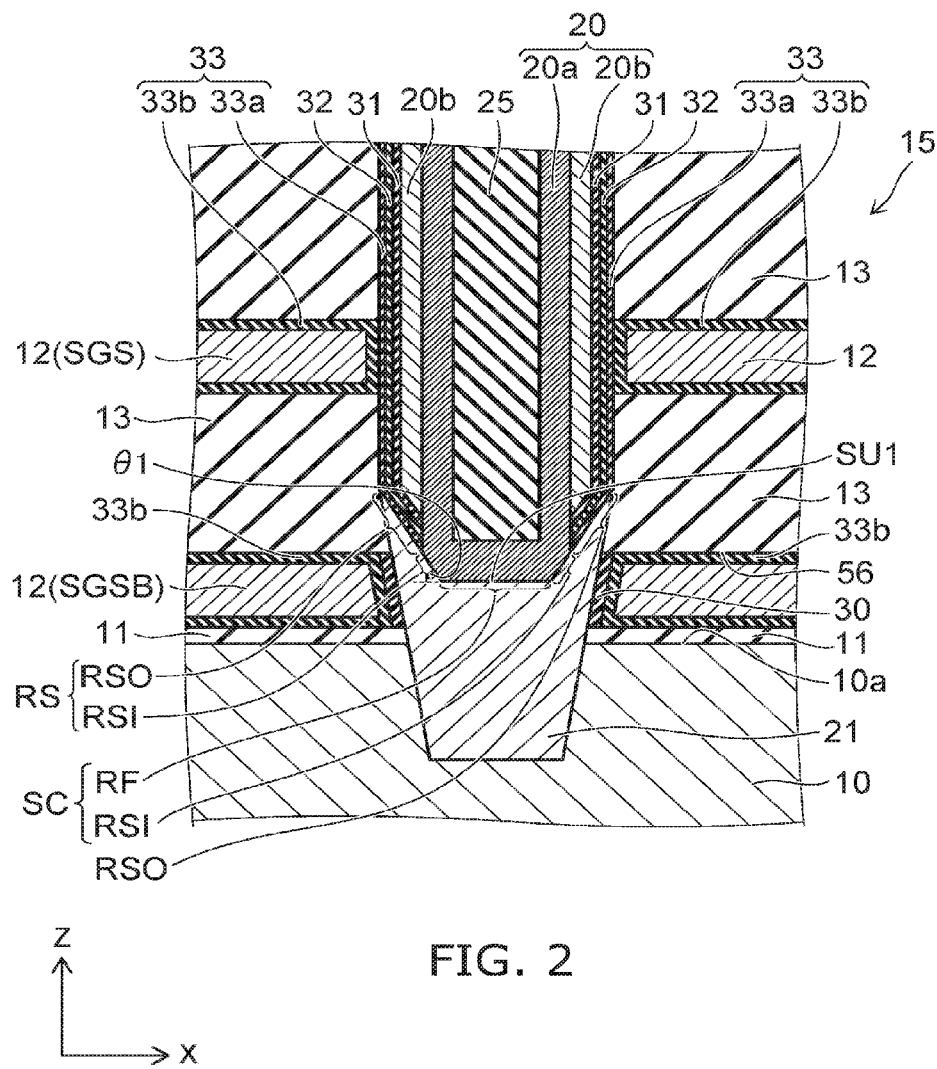
FIG. 2 is a cross-sectional view showing the semiconductor memory device according to the first embodiment.

FIG. 2 is a cross-sectional view showing the semiconductor memory device according to the embodiment.

The semiconductor memory device according to the embodiment is a stacked type nonvolatile semiconductor memory device.

As shown in FIG. 1, a silicon substrate 10 is provided in the semiconductor memory device 1 according to the embodiment.

In the specification hereinbelow, an XYZ orthogonal coordinate system is employed for convenience of description. Two mutually-orthogonal directions parallel to an upper surface 10a of the silicon substrate 10 are taken as an "X-direction" and a "Y-direction;" and a direction perpendicular to the upper surface 10a of the silicon substrate 10 is taken as a "Z-direction." Also, in the specification, although the direction in which the upper surface 10a faces in the Z-direction also is called "up," and the reverse direction also is called "down," this differentiation is for convenience and is independent of the direction of gravity.

A silicon oxide film 11 is provided on the silicon substrate 10. In the specification, "silicon oxide film" refers to a film having silicon oxide (SiO) as a major component. Accordingly, the silicon oxide film 11 includes silicon (Si) and oxygen (O). Also, because silicon oxide generally is an insulating material, the silicon oxide film is an insulating film unless otherwise indicated. This is similar for the other constituents as well; and in the case where the material name is included in the name of the constituent, the material is a major component of the constituent.

Electrode films 12 and silicon oxide films 13 are stacked alternately along the Z-direction on the silicon oxide film 11. A stacked body 15 is formed of the silicon oxide film 11, and of the multiple electrode films 12 and the multiple silicon oxide films 13 that are stacked alternately.

Multiple source electrode plates 17 are provided inside the stacked body 15. The configuration of the source electrode plate 17 is a plate configuration; the longest longitudinal direction of the source electrode plate 17 is the Y-direction; the next longest width direction is the Z-direction; and the shortest thickness direction is the X-direction. The lower end of the source electrode plate 17 is connected to the silicon substrate 10.

Silicon pillars 20 that extend in the Z-direction are provided inside the stacked body 15. The silicon pillar 20 is made of polysilicon; and the configuration of the silicon pillar 20 is a circular tube having a plugged lower end portion. When viewed from the Z-direction, the silicon pillars 20 are arranged periodically along multiple columns, e.g., four columns. Each column extends in the Y-direction; and the positions of the silicon pillars 20 in the Y-direction are shifted one-half period between mutually-adjacent columns. The configuration of the silicon pillar 20 may be a circular columnar configuration.

Multiple bit lines BL and a source line SL that extend in the X-direction are provided on the stacked body 15. The bit lines BL are provided higher than the source line SL. The source line SL is connected to the upper end of the source electrode plate 17 via a plug (not shown). Also, the bit lines BL are connected to the upper ends of the silicon pillars 20 via plugs 23.

In the stacked body 15, the electrode film 12 of one or multiple levels from the top functions as an upper selection gate line SGD; and an upper selection gate transistor STD is configured at each intersection between the upper selection gate line SGD and the silicon pillars 20. Also, the electrode film 12 of the lowermost level functions as a dummy gate line SGSB. The electrode film 12 of one or multiple levels those stacked the second and following levels from the bottom functions as a lower selection gate line SGS; and a lower selection gate transistor STS is configured at each intersection between the lower selection gate line SGS and the silicon pillars 20. The electrode films 12 other than the lower selection gate line SGS and the upper selection gate line SGD function as word lines WL; and a memory cell transistor MC is configured at each intersection between the word lines WL and the silicon pillars 20. Thereby, a NAND string is formed by the multiple memory cell transistors MC being connected in series along each silicon pillar 20 and by the lower selection gate transistor STS and the upper selection gate transistor STD being connected to the two ends of the multiple memory cell transistors MC.

As shown in FIG. 2, a body silicon 20a and a cover silicon 20b that is provided on a side surface of the body silicon 20a are provided in the silicon pillar 20. A core member 25 that is made of silicon oxide is provided inside the silicon pillar 20.

A tunneling insulating film 31 is provided on the side surface of the silicon pillar 20. Although the tunneling insulating film 31 normally is insulative, the tunneling insulating film 31 is a film in which a tunneling current flows when a prescribed voltage within the range of the drive voltage of the semiconductor memory device 1 is applied; and the tunneling insulating film 31 is, for example, a single-layer silicon oxide film or an ONO film in which a silicon oxide layer, a silicon nitride layer, and a silicon oxide layer are stacked in this order.

A charge storage film 32 is provided on a side surface of the tunneling insulating film 31. The charge storage film 32 is a film that can store charge, and is formed of, for example, silicon nitride. A silicon oxide layer 33a is provided on a side surface of the charge storage film 32. The tunneling insulating film 31, the charge storage film 32, and the silicon oxide layer 33a are disposed on substantially the entire side surface of the silicon pillar 20; and the configurations thereof are circular tubes.

An aluminum oxide layer 33b is provided as a high dielectric constant layer on an upper surface of the electrode film 12, on a lower surface of the electrode film 12, and on a side surface of the electrode film 12 facing the silicon pillar 20. A hafnium oxide layer may be provided instead of the aluminum oxide layer 33b. The high dielectric constant layer is an insulating layer having a higher relative dielectric constant than that of the silicon oxide layer. A blocking insulating film 33 is formed of the silicon oxide layer 33a and the aluminum oxide layer 33b. The blocking insulating film 33 is a film in which a current substantially does not flow even when a voltage within the range of the drive voltage of the semiconductor memory device 1 is applied.

An epitaxial silicon member 21 is provided over from the interior of the substrate 10 to the interior of the stacked body 15 between the silicon substrate 10 and the stacked body 15. A lower portion of the epitaxial silicon member 21 is disposed inside the silicon substrate 10, and an upper portion of the epitaxial silicon member 21 is disposed inside the stacked body 15. The epitaxial silicon member 21 is a silicon member epitaxially grown from the silicon substrate 10 as a starting point, therefore, a crystal structure of the silicon substrate 10 and a crystal structure of the epitaxial silicon member 21 are continuous. The configuration of the epitaxial silicon member 21 is substantially a circular columnar configuration. A front surface of the lower portion of the epitaxial silicon member 21 contacts the silicon substrate 10 and an upper surface of the epitaxial silicon member 21 contacts the silicon pillar 20.

A flat region RF having a substantially circular configuration and an inclined region RS that surrounds the flat region RF and has a substantially annular configuration are provided on the upper surface SU1 of the epitaxial silicon member 21. The flat region RF is substantially parallel to the upper surface 10a of the silicon substrate 10, i.e., the XY plane. The flat region RF contacts the silicon pillar 20. The inclined region RS is a region having a facet configuration in which the height of the inner side is low and that of the outer side is high, the position of the inclined region RS is displaced upward, i.e., the silicon pillar 20 side, toward the outer side. An angle θ1 formed between the upper surface 10a of the silicon substrate 10 and the inclined region RS is not less than 40° and not more than 70°, for example, is not less than 54° and not more than 55°, and, for example, is 54.7°. For example, the upper surface 10a of the silicon substrate 10 is a (100) plane of the silicon crystal, the flat region RF is a (110) plane of the silicon crystal, and the inclined region RS is a (111) plane of the silicon crystal.

An inner region RSI of the inclined region RS contacts the silicon pillar 20 and an outer region RSO of the inclined region RS contacts the silicon oxide layer 33a. A contact surface SC contacting the silicon pillar 20 includes the flat region RF and the inner region RSI of the upper surface SU1 of the epitaxial silicon member 21. Therefore, the contact surface SC is convex downward, i.e., toward the epitaxial silicon member 21.

A silicon oxide film 30 is provided between the epitaxial silicon member 21 and the aluminum oxide layer 33b that is formed at the periphery of the electrode film 12 of the lowermost level (the dummy gate line SGSB).

A method for manufacturing the semiconductor memory device according to the embodiment will now be described.

FIG. 3 to FIG. 9 are cross-sectional views showing the method for manufacturing the semiconductor memory device according to the embodiment and show a cross section corresponding to FIG. 2.

Figure 3:
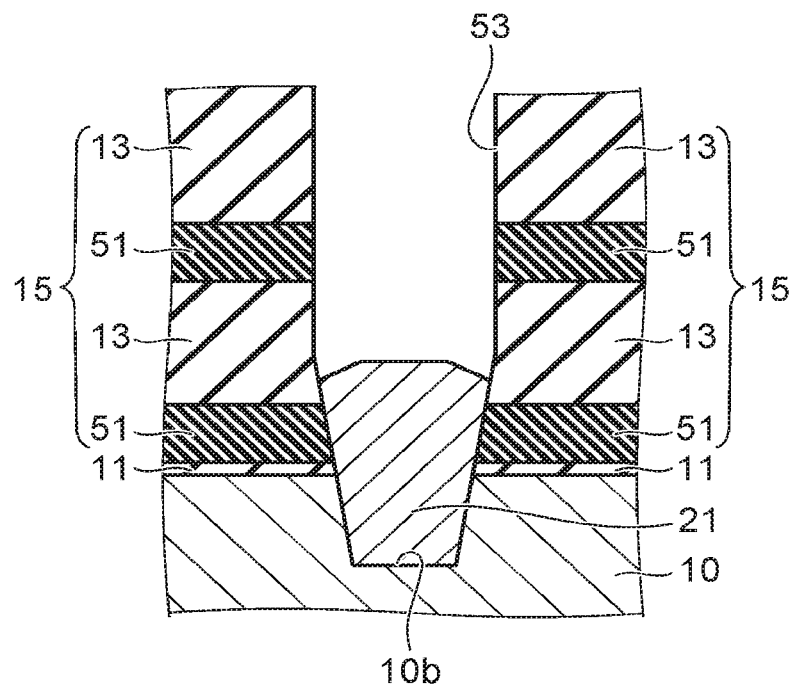
FIG. 3 to FIG. 9 are cross-sectional views showing a method for manufacturing a semiconductor memory device according to the first embodiment.

First, as shown in FIG. 3, the silicon oxide film 11 is formed on the silicon substrate 10. Then, silicon nitride films 51 and silicon oxide films 13 are formed alternately. A stacked body 15 is formed of the silicon oxide film 11, the multiple silicon nitride films 51, and the multiple silicon oxide films 13. Then, a memory hole 53 is made in the stacked body 15 by, for example, lithography and RIE (Reactive Ion Etching). The memory hole 53 reaches the silicon substrate 10 and enters an upper layer portion of the silicon substrate 10. Thereby, a recess 10b is made on the upper surface 10a of the silicon substrate 10.

Then, silicon is epitaxially grown from an inner surface of the recess 10b of the silicon substrate 10 as a starting point. Thereby, epitaxial silicon member 21 is formed at a lower portion of inside the memory hole 53. At this time, the lower portion of the epitaxial silicon member 21 is disposed inside the recess 10b of the silicon substrate 10, and an upper portion of the epitaxial silicon member 21 is disposed inside the stacked body 15. The upper surface SU1 of the epitaxial silicon member 21 becomes convex upward.

Figure 4:
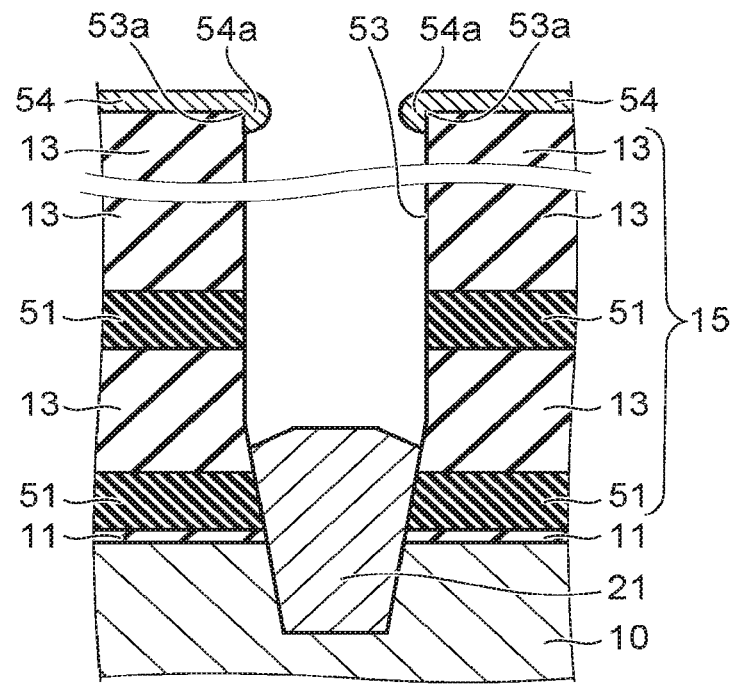

Then, as shown in FIG. 4, a mask film 54 which contains carbon is formed on an upper surface of the stacked body 15, for example, by PECVD (Plasma Enhanced Chemical Vapor Deposition). Because the coverage of the mask film 54 is low, the mask film attaches at an upper end edge 53a of the memory hole 53 without entering inside the memory hole 53. Thereby, a flange part 54a which extends from the upper end edge 53a toward a center of the memory hole 53 and has a ring configuration is formed.

Figure 5:
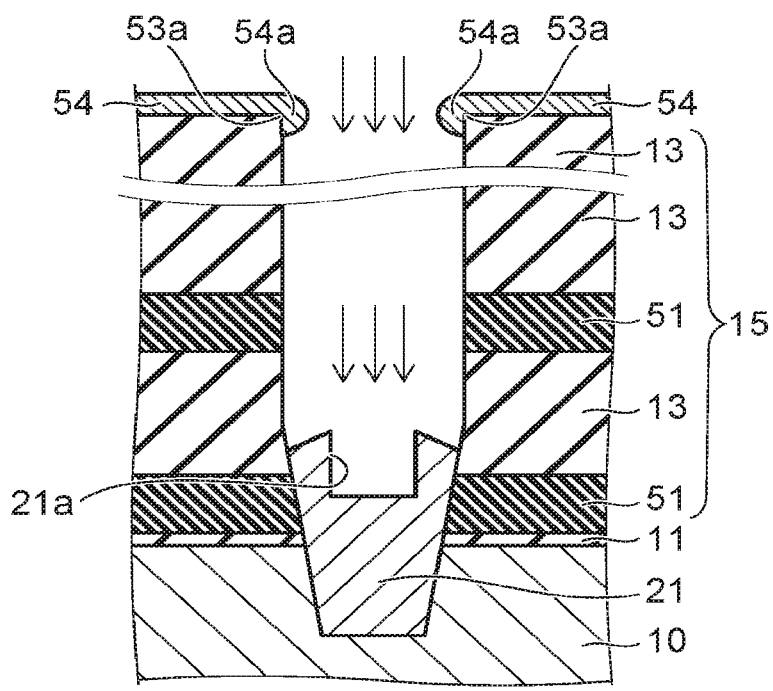

Then, as shown in FIG. 5, dry etching, such as RIE, is performed. Thereby, a portion of the epitaxial silicon member 21 is removed. At this time, when viewed from above, a recess 21a is made in the center portion of the epitaxial silicon member 21 because the flange part 54a of the mask film 54 works as a mask for RIE.

Figure 6:
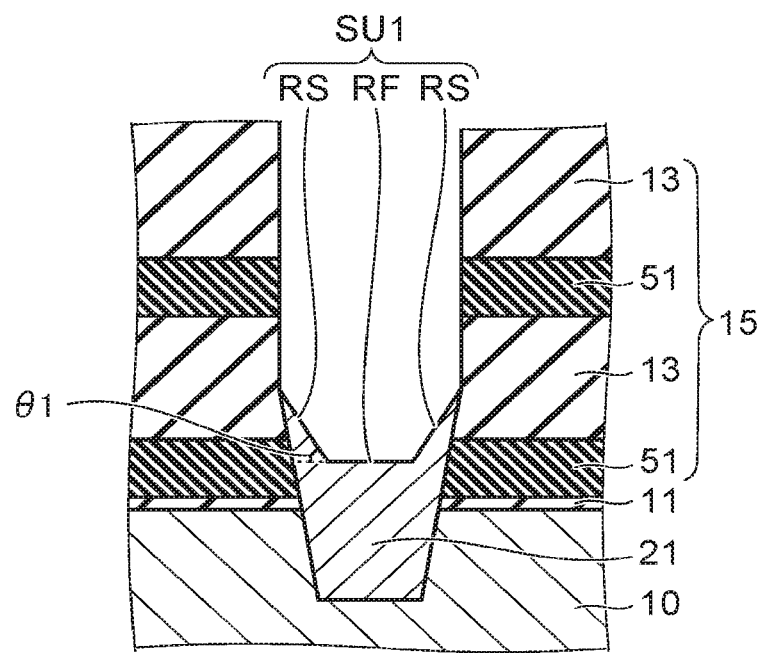

Then, as shown in FIG. 6, wet etching is performed using, for example, an alkaline etchant. Thereby, an exposed surface of the epitaxial silicon member 21 is etched and a silicon crystal plane is disclosed on the upper surface SU1 of the epitaxial silicon member 21. Specifically, the flat region RF that is made of (110) plane of a silicon crystal and inclined region RS that is made of (111) plane of a silicon crystal are appeared on the upper surface SU1. The inclined region RS is positioned at the periphery of the flat region RF and has a facet configuration that inclines by, for example, 54.7° with respect to the flat region RF and the upper surface 10a of the silicon substrate 10. Also, a portion, where a damage was introduced, of the epitaxial silicon member 21 by RIE shown in FIG. 5 is removed by this wet etching. Therefore, there is substantially no damage caused by RIE on the upper surface SU1 of the epitaxial silicon member 21.

Figure 7:
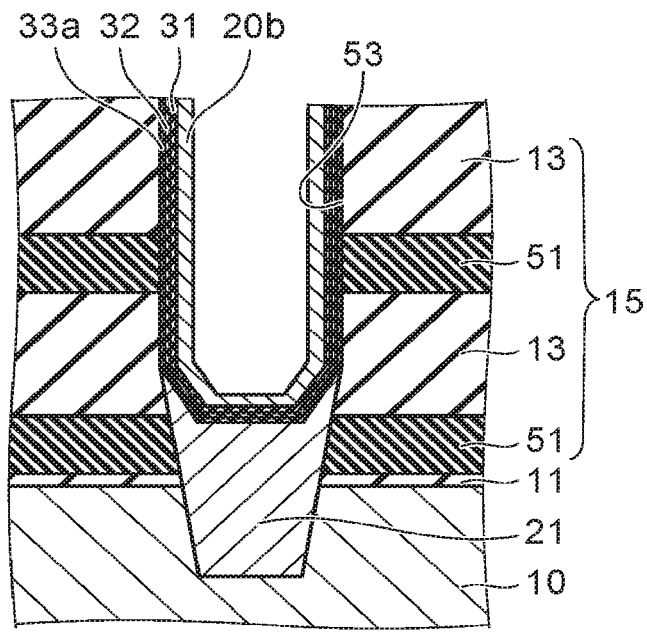

Then, as shown in FIG. 7, the silicon oxide layer 33a, the charge storage film 32, and the tunneling insulating film 31 are formed in this order on an inner surface of a portion above the epitaxial silicon member 21 in the memory hole 53. Then, the cover silicon layer 20b is formed on a front surface of the tunneling insulating film 31 by depositing amorphous silicon.

Figure 8:
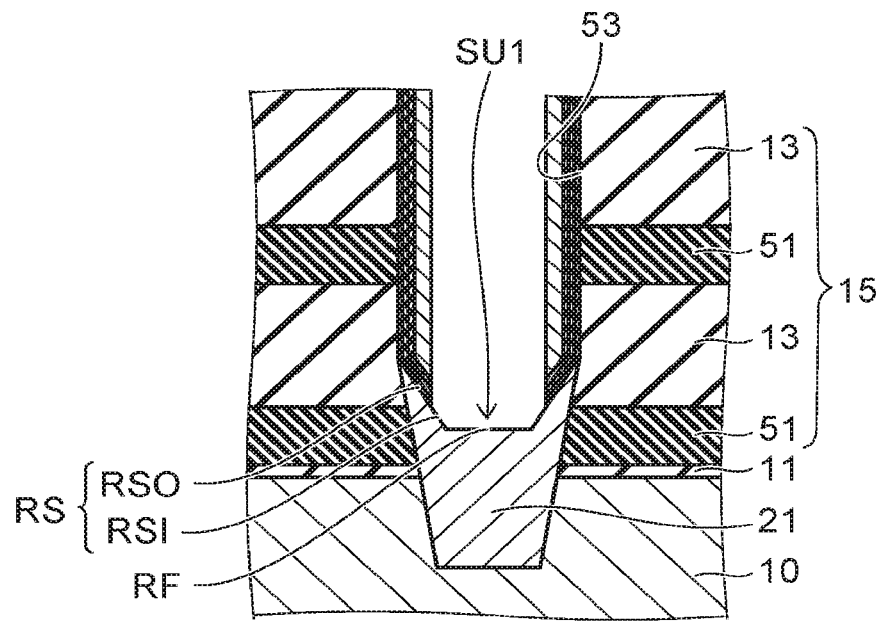

Then, as shown in FIG. 8, the portions of the cover silicon layer 20b, the tunneling insulating film 31, the charge storage film 32, and the silicon oxide layer 33a that are deposited on the bottom surface of the memory hole 53 are removed by performing RIE. Thereby, the epitaxial silicon member 21 is exposed at the bottom surface of the memory hole 53. At this time, the entire flat region RF of the upper surface SU1 of the epitaxial silicon member 21 and the inner region RSI of the inclined region RS are exposed and the outer region RSO of the inclined region RS is covered by such as the silicon oxide layer 33a.

Figure 9:
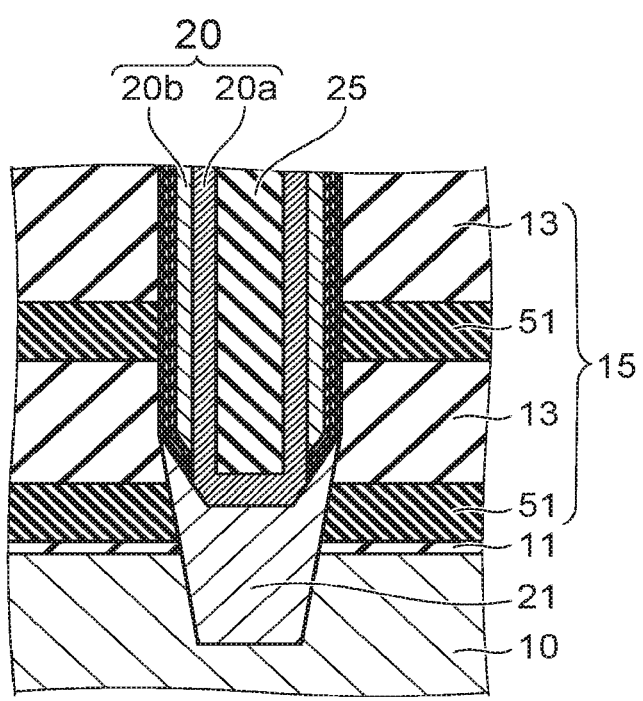

Then, as shown in FIG. 9, after performing wet treatment using DHF (Diluted Hydrofluoric acid), the body silicon 20a is formed by depositing amorphous silicon. The body silicon 20a contacts the exposed surface of the epitaxial silicon member 21, i.e., the entire flat region RF and the inner region RSI of the inclined region RS. The silicon pillar 20 is formed of the cover silicon layer 20b and the body silicon 20a. Then, a core member 25 is filled in a reminding portion of the memory hole 53 by depositing silicon oxide.

Then, as shown in FIG. 1, multiple slits 55 that extend in the Y-direction and reach the silicon substrate 10 are made in portions of the stacked body 15 where the silicon pillars 20 are not formed.

Then, as shown in FIGS. 1 and 2, wet etching is performed via the slit 55. The conditions of the wet etching are conditions such that silicon nitride is etched selectively with respect to silicon oxide; and, for example, hot phosphoric acid is used as the etchant. Thereby, the silicon nitride film 51 is removed via the slit 55; and a space 56 is made. At this time, the silicon oxide film 11 and the silicon oxide films 13 and the silicon oxide layer 33a function as an etching stopper and are exposed at the inner surface of the space 55.

Then, an exposed surface of the epitaxial silicon member 21 that exposed at a back surface of the space 56 of the lowermost level is oxidized by performing oxidation treatment such as WVG (Water Vapor Generator). Thereby, the silicon oxide film 30 is formed.

Then, aluminum oxide is deposited by, for example, CVD. Thereby, the aluminum oxide layer 33b is formed on the inner surface of the space 56. The aluminum oxide layer 33 contacts the silicon oxide layer 33a at the back surface of the space 56. The blocking insulating film 33 is formed of the aluminum oxide layer 33b and the silicon oxide layer 33a.

Then, a metal nitride, e.g., titanium nitride, is deposited by, for example, CVD and subsequently tungsten is deposited. Thereby, the electrode film 12 is formed inside the space 56. Then, a portion of the electrode film 12 that is deposited inside the slit 55 are removed by etching.

Then, the insulating film (not shown) is formed on an inner surface of the slit 55 by depositing silicon oxide. Then, the insulating film is removed from the bottom surface of the slit 55 by RIE. Then, the source electrode plate 17 is formed in the slit 55 by filling a metal material such as tungsten. The source electrode plate 17 is connected to the silicon substrate 10.

Then, the insulating film (not shown) is formed on the stacked body 15; and the plugs 23 are formed inside the insulating film. The plugs 23 are connected to the silicon pillars 20. Then, the source line SL that extends in the X-direction is formed on the insulating film and is connected to the source electrode plates 17 via plugs (not shown). Also, the bit lines BL that extend in the X-direction are formed on the insulating film and connected to the plugs 23. Thus, the semiconductor memory device 1 according to the embodiment is manufactured.

Effects of the embodiment will now be described.

In the semiconductor memory device 1 according to the embodiment, the contact surface SC between the epitaxial silicon member 21 and the silicon pillar 20 is convex downward. In other words, the contact surface SC includes the inner region RSI of the inclined region RS in addition to the flat region RF. Therefore, a surface area of the contact surface SC is large compared to the case where the contact surface SC includes only a flat region. As a result, the electrical resistance between the epitaxial silicon member 21 and the silicon pillar 20 is low and conductivity is excellent. Thereby, even in the case where the diameter of the epitaxial silicon member 21 and the silicon pillar 20 is set to be small for realizing higher integration of the semiconductor memory device 1, cell current flowing in the silicon pillar 20 can be secured. Thereby, a stability of operation of the semiconductor device 1 is improved.

The contact surface SC includes only the inclined region RS without including the flat region RF. Thereby, the surface area of the contact surface SC is increased even further. Also, CDE (Chemical Dry Etching) that uses oxygen plasma and a gas containing carbon and fluorine may be performed instead of the dry etching shown in FIG. 5 and wet etching shown in FIG. 6. In such a case, because much of electrically neutral oxygen plasma reaches in the center portion of the upper surface SU1, the configuration of the upper surface SU1 can be made convex downward.

Second Embodiment

A second embodiment will now be described.

Figure 10:
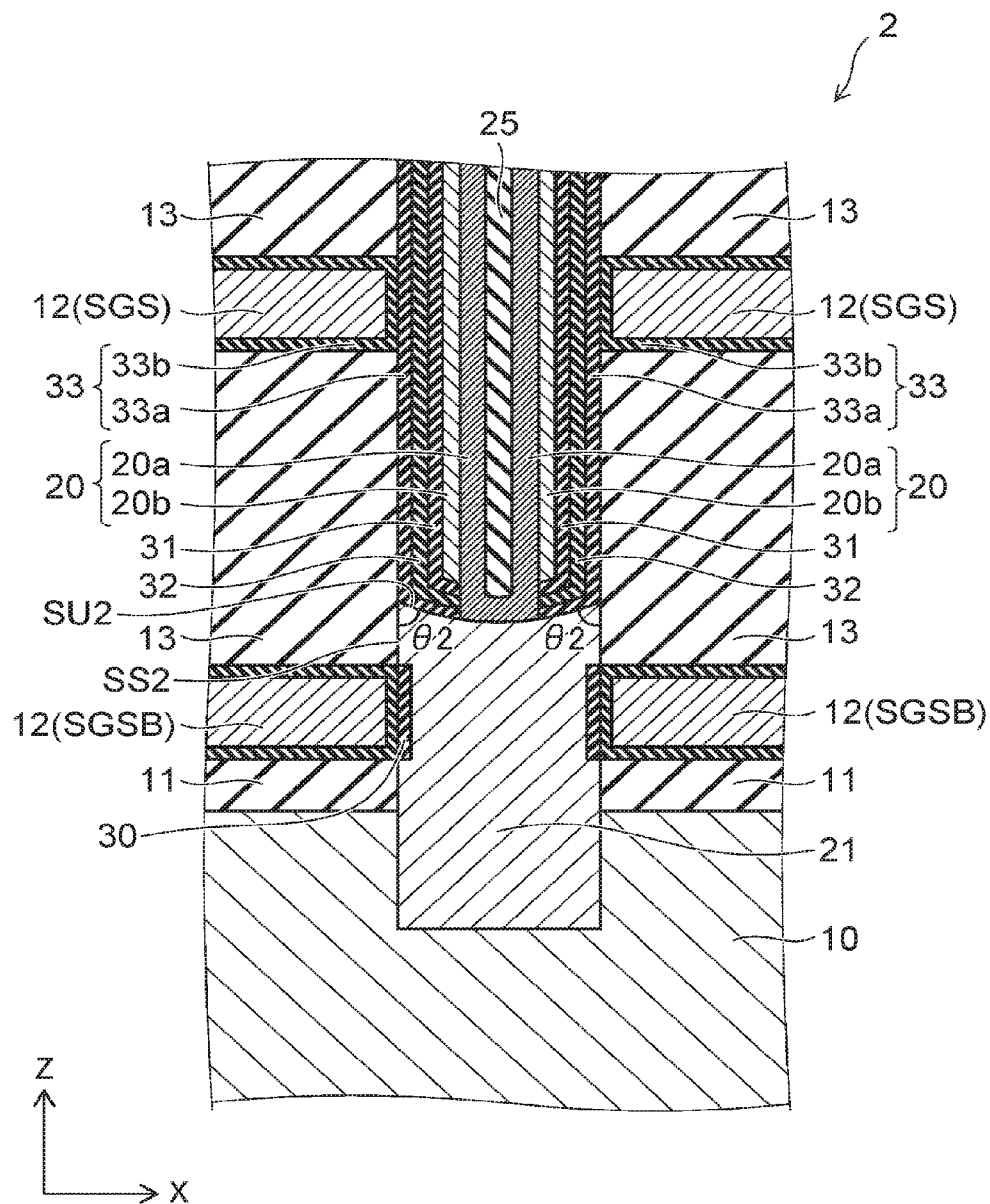
FIG. 10 is a cross-sectional view showing a semiconductor memory device according to a second embodiment.

FIG. 10 is a cross-sectional view showing a semiconductor memory device according to the embodiment.

The entire configuration of the semiconductor memory device 2 according to the embodiment is the same as that of the device shown in FIG. 1.

As shown in FIG. 10, in such a semiconductor memory device 2 according to the embodiment, the configuration of an upper surface SU2 of the epitaxial silicon member 21 is convex downward, and an angle θ2 formed between the peripheral region on the upper surface SU2 and a side surface SS2 of the epitaxial silicon member 21 is less than 90°, i.e., an acute angle. Also, an angle θ3 formed between the upper surface SU2 and the side surface of the memory hole 53 higher than the upper surface SU2 is an obtuse angle. Otherwise, the configuration of the embodiment is similar to that of the first embodiment described above.

A method for manufacturing the semiconductor memory device according to the embodiment will now be described.

FIG. 11 to FIG. 14 are cross-sectional views showing the method for manufacturing the semiconductor memory device according to the embodiment.

Figure 11:
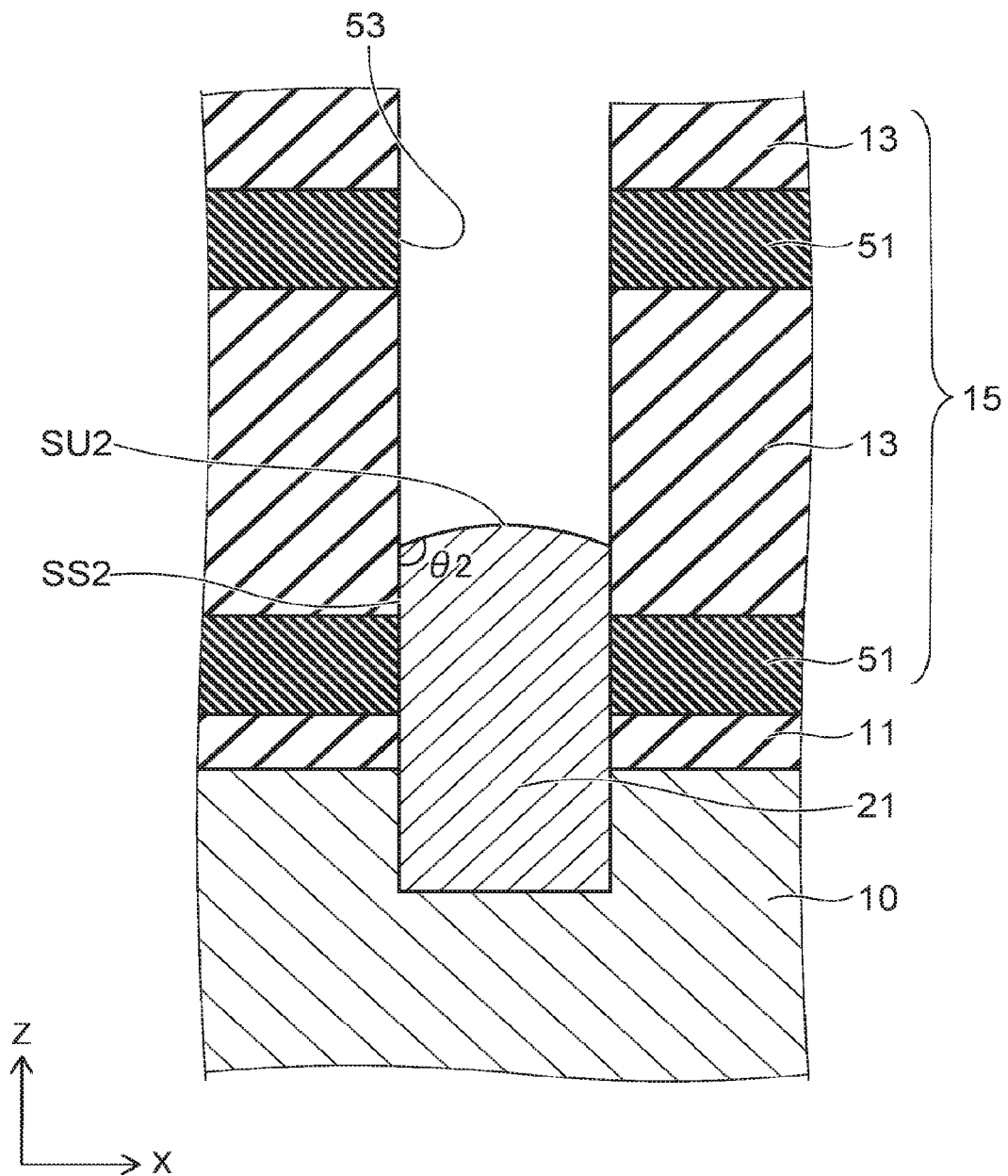
FIG. 11 to FIG. 14 are cross-sectional views showing a method for manufacturing a semiconductor memory device according to the second embodiment.

First, as shown in FIG. 11, the stacked body 15 is formed on the silicon substrate 10, the memory hole 53 is made in the stacked body 15 and the epitaxial silicon member 21 is formed by performing epitaxial growth of silicon from the silicon substrate 10 as a starting point at the bottom surface of the memory hole 53, similar to the method shown in the first embodiment described above. At this stage, the configuration of the upper surface SU2 of the epitaxial silicon member 21 is convex upward. In other words, the angle θ2 formed between the upper surface SU2 and the side surface SS2 of the epitaxial silicon member 21 is an acute angle.

Figure 12:
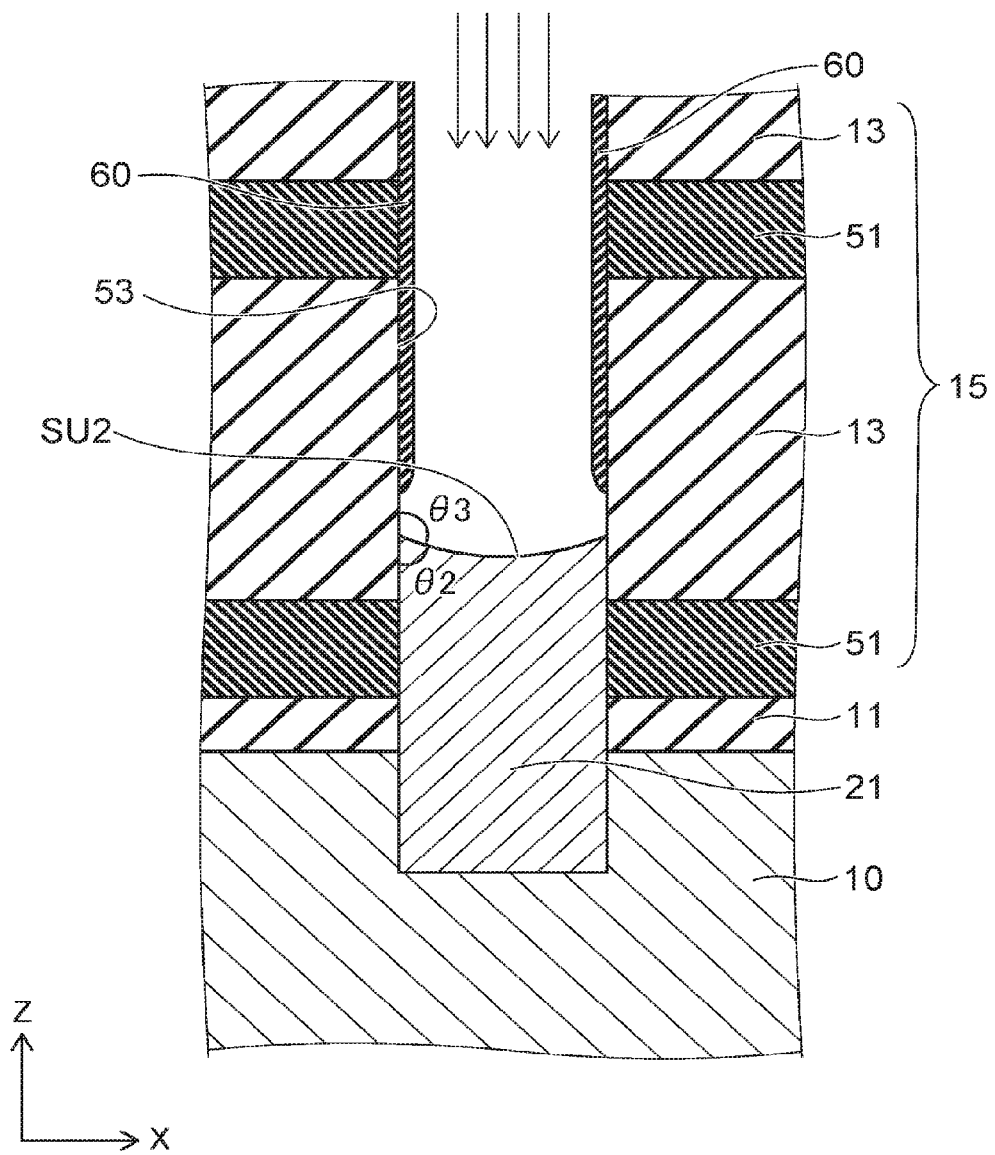

Then, as shown in FIG. 12, dry etching, such as RIE, is performed from above. For example, a gas containing carbon (C) and fluorine (F), or a gas containing chlorine (Cl) is used for an etching gas. At this time, a byproduct 60 is attached on the side surface of the memory hole 53. By controlling the composition and quantity of the byproduct 60, etching ion is made to be hard to reach the region proximal to the side surface of the memory hole 53 and the ion is made to be easy to reach the region distal to the side surface of the memory hole 53, in the upper surface SU2 of the epitaxial silicon member 21.

As a result, more of the center portion can be etched than that of the peripheral portion of the upper surface SU2, and the configuration of the upper surface SU2 can be convex downward. Thereby, the angle θ2 becomes an acute angle and the angle θ3 formed between the upper surface SU2 of the epitaxial silicon member 21 and the side surface of the memory hole 53 higher than the upper surface SU2 becomes an obtuse angle. Subsequently, the byproduct 60 is removed by cleaning inside the memory hole 53.

Figure 13:
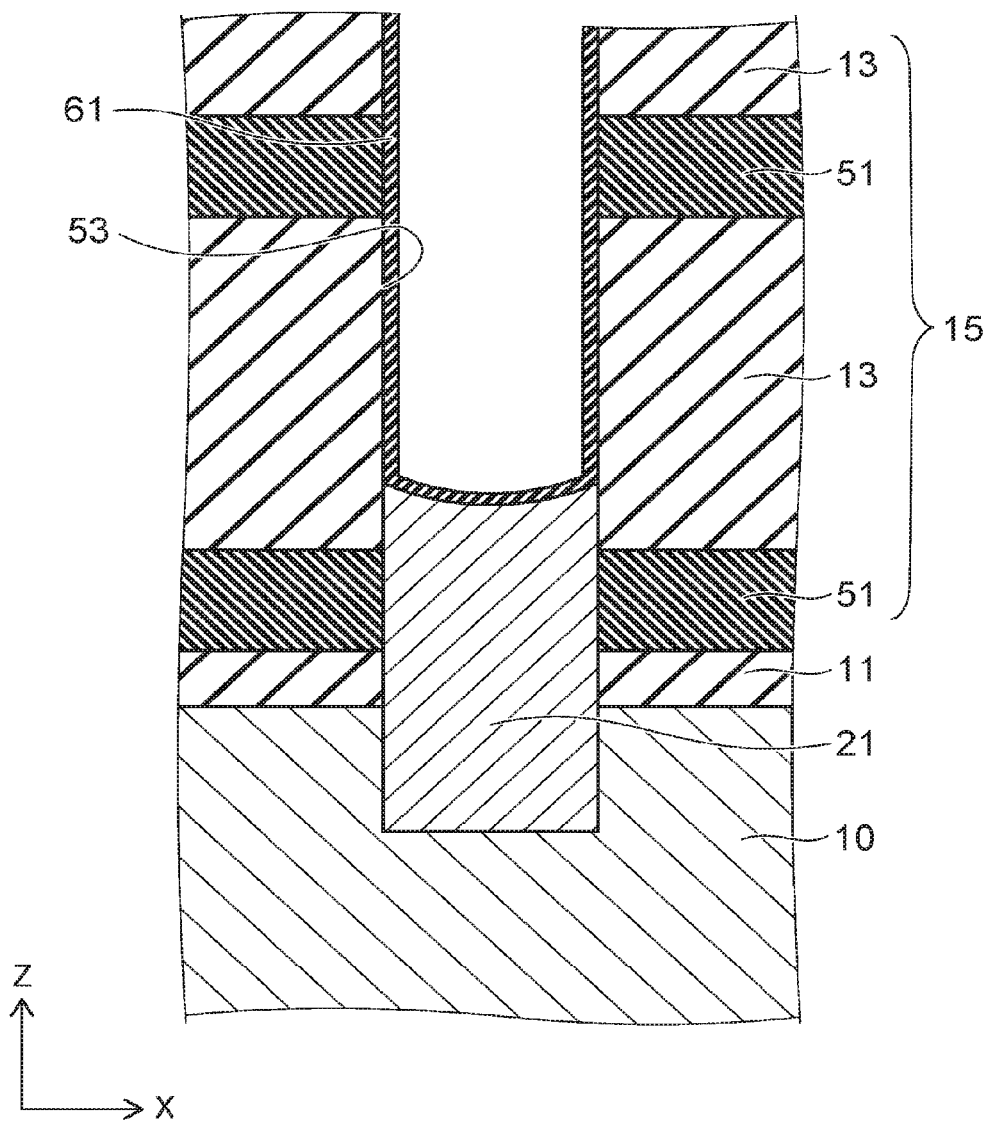

Then, as shown in FIG. 13, a silicon nitride layer 61 is formed on the inner surface of a portion of the memory hole 53 where the epitaxial silicon member 21 is not filled.

Figure 14:
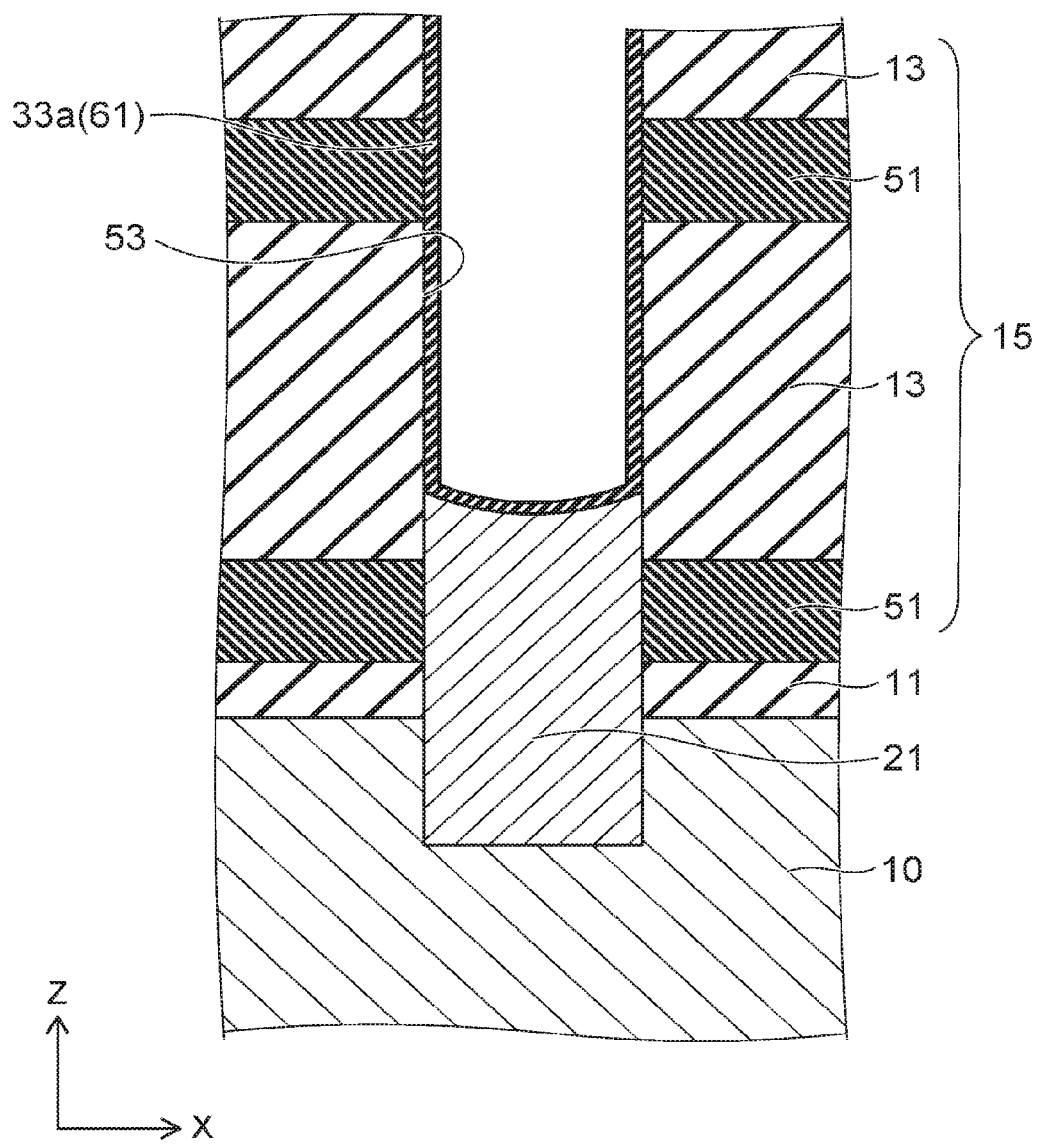

Then, as shown in FIG. 14, the silicon oxide layer 33a is formed by oxidizing the silicon nitride layer 61 (referring to FIG. 13) by performing oxidation treatment. The subsequent processes are similar to those of the first embodiment described above.

Effects of the embodiment will now be described.

In the embodiment, dry etching, such as RIE, is performed to the epitaxial silicon member 21 in the process shown in FIG. 12. Thereby, the angle θ2 becomes an acute angle and the angle θ3 becomes an obtuse angle. Therefore, a hollow having an acute angle does not exist on a foundation when the silicon nitride layer 61 is formed in the process shown in FIG. 13. As a result, entire portion of the silicon nitride layer 61 is oxidized and an unoxidized portion does not remain when the silicon oxide layer 33a is formed by oxidizing the silicon nitride layer 61 in the process shown in FIG. 14. Accordingly, the unoxidized portion of the silicon nitride layer 61 contacts the silicon nitride film 51 and the unoxidized portion of the silicon nitride layer 61 is not removed together with the silicon nitride film 51 when the silicon nitride film 51 is removed in the subsequent process. In case where the unoxidized portion of the silicon nitride layer 61 is removed, the electrode film 12 enters in that portion and causes a breakdown voltage between the epitaxial silicon member 21 and the electrode film 12 to decrease.

Also, in the embodiment, because there is no possibility that the unoxidized portion of the silicon nitride layer 61 contacts the silicon nitride film 51, the epitaxial silicon member 21 can disposed in the vicinity of the lower selection gate line SGS. As a results, the distance between the lower end portion of the silicon pillar 20 and the lower selection gate line SGS becomes shorter and the controllability of the lower selection gate transistor STS is improved. More specifically, by making the upper surface SU2 of the epitaxial silicon member 21 close to the lower selection gate line SGS, a distance between the lower end portion of the silicon pillar 20 and the lower selection gate line SGS becomes shorter and the on-current increases. Also, because the charge storage film 32 is not formed on the portion distal to the lower selection gate line SGS, an upper limit value of a threshold voltage of the lower selection gate transistor STS is regulated. Thereby, stability in operation of the semiconductor device 2 is improved.

COMPARATIVE EXAMPLE

A comparative example will now be described.

Figure 15:
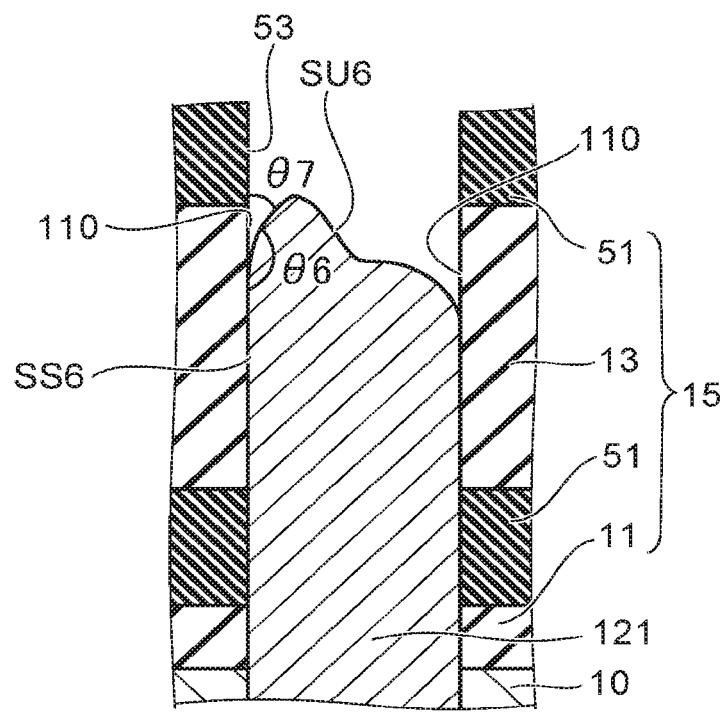
FIGS. 15 and 21 are cross-sectional views showing a method for manufacturing a semiconductor memory device according to a comparative example.
Figure 21:
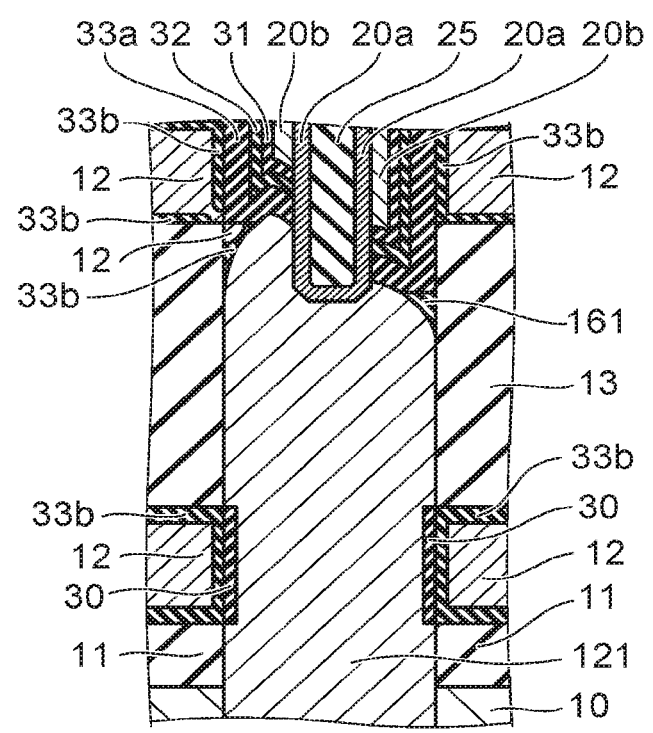

FIGS. 15 and 21 are cross-sectional views showing a method for manufacturing a semiconductor memory device according to the comparative example.

As shown in FIG. 15, in the comparative example, an angle θ6 formed between an upper surface SU6 and a side surface SS6 of the epitaxial silicon member 121 is an obtuse angle. Therefore, an angle θ7 formed between the upper surface SU6 and the side surface of the memory hole 53 higher than the upper surface SU6 is an acute angle. Thereby, a hollow 110 having an acute angle is formed between the upper surface SU6 of the epitaxial silicon member 121 and the side surface of the memory hole 53. Also, the fluctuation of the position of the upper surface SU6 in the Z-direction occurs and a portion of the upper surface SU6 is positioned in the vicinity of the silicon nitride film 51.

Figure 16:
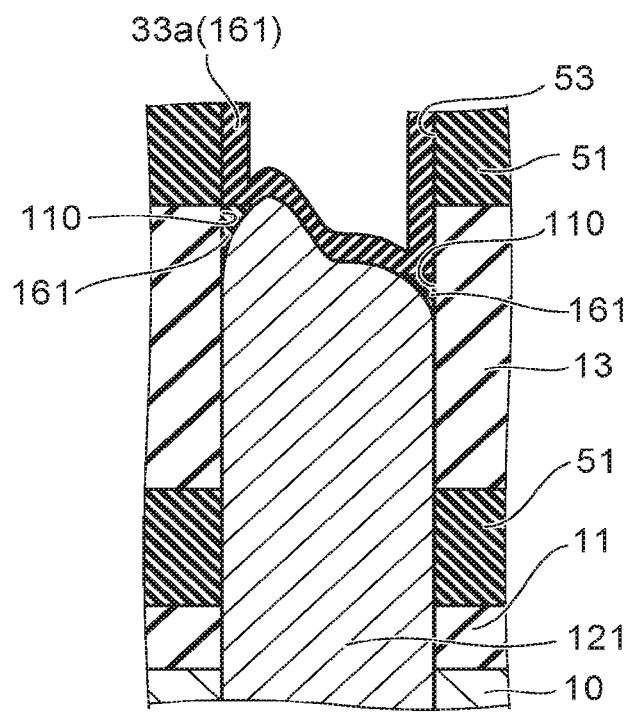

Then, as shown in FIG. 16, a silicon nitride layer 61 is formed and the silicon nitride layer 61 is modified into the silicon oxide layer 33a by performing oxidation treatment. At this time, a portion formed in the hollow 110 of the silicon nitride layer 61 is insufficiently oxidized and becomes an unoxidized portion 161. A portion of the unoxidized portion 161 contacts the silicon nitride film 51.

Figure 17:
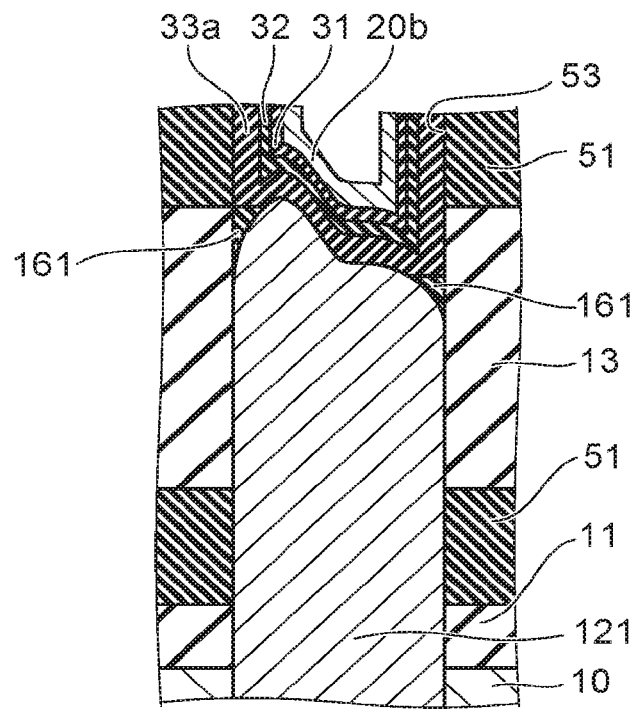

Then, as shown in FIG. 17, the charge storage film 32, the tunneling insulating film 31 and the cover silicon layer 20b is formed on a front surface of the silicon oxide layer 33a.

Figure 18:
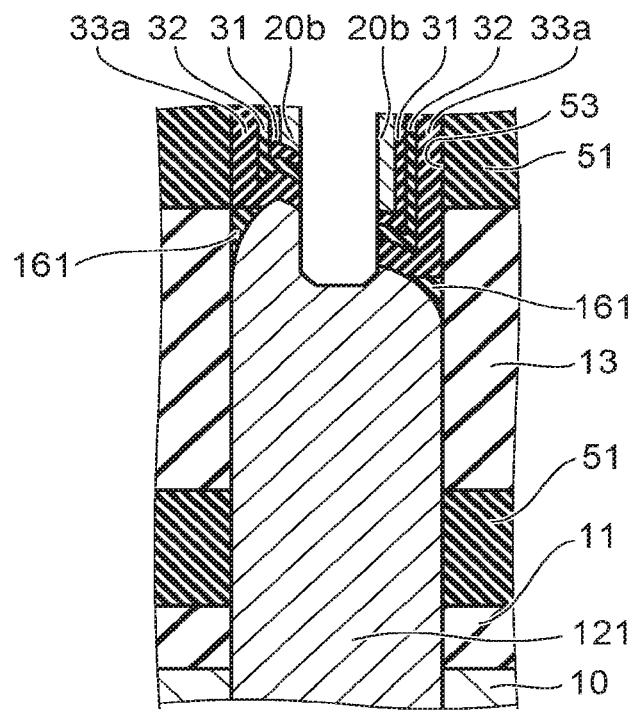

Then, as shown in FIG. 18, the portions of the cover silicon layer 20b, the tunneling insulating film 31, the charge storage film 32, and the silicon oxide layer 33a that are formed on the bottom surface of the memory hole 53 are removed by performing RIE. Thereby, the epitaxial silicon member 21 is exposed at the bottom surface of the memory hole 53.

Figure 19:
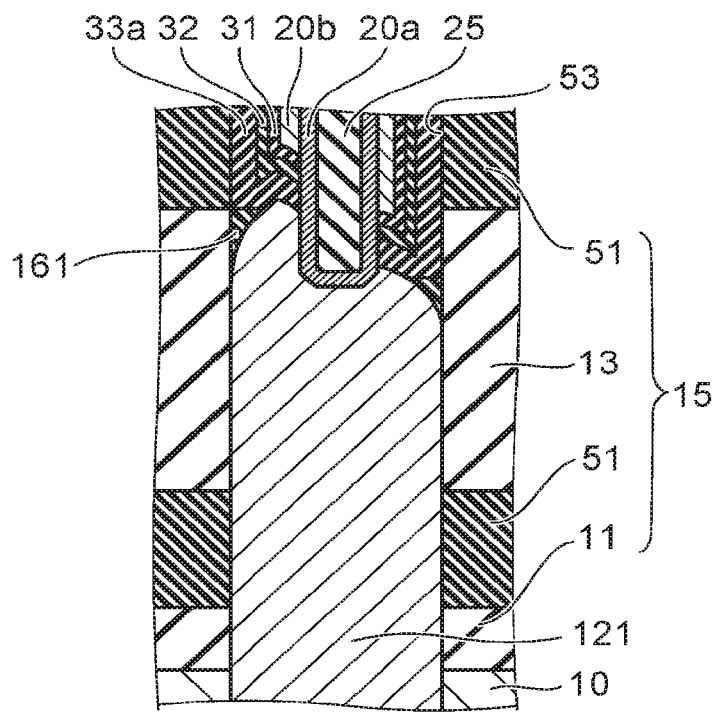

Then, as shown in FIG. 19, the body silicon 20a is formed on a front surface of the cover silicon layer 20b. Then, the core member 25 is formed on a front surface of the body silicon 20a.

Figure 20:
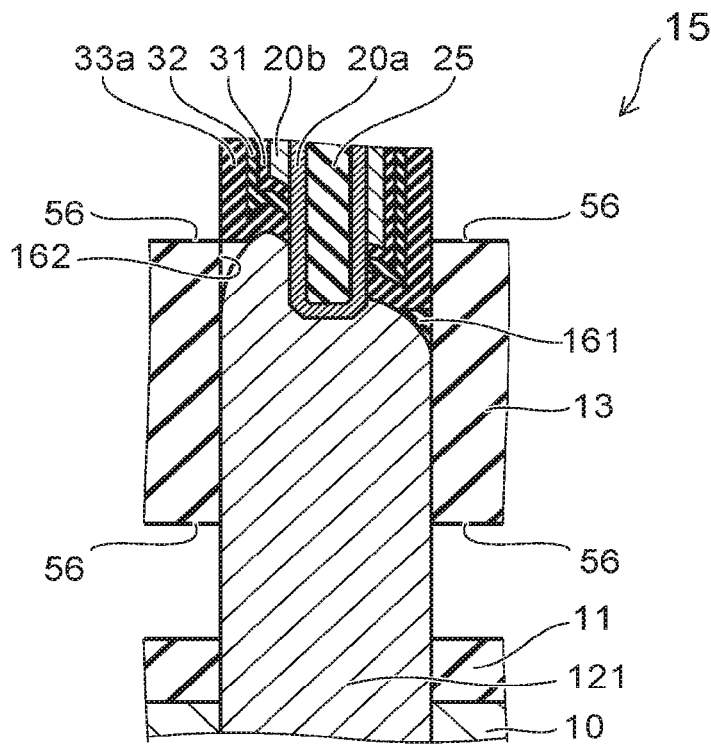

Then, as shown in FIG. 20, the slits 55 (referring to FIG. 1) are made in the stacked body 15. Then, the silicon nitride film 51 (referring to FIG. 19) is removed by performing a wet etching using phosphoric acid via the slits 55. The space 56 is made in a portion where the silicon nitride film 51 is removed. At this time, the unoxidized portion 161 that contacts the silicon nitride film 51 is also removed and a cavity 162 that communicates with the space 56 is made.

Then, as shown in FIG. 21, the silicon oxide film 30 is formed by oxidizing the exposed surface of the epitaxial silicon member 21 in the space 56 of the lowermost level by performing oxidation treatment such as WVG; the aluminum oxide layers 33b are formed on inner surfaces of the spaces 56; and the electrode films 12 are formed by filling tungsten in the spaces 56. At this time, the electrode film 12 is undesirably filled also in the cavity 162.

Therefore, the semiconductor memory device according to the comparative example, the breakdown voltage between the epitaxial silicon member 121 and the electrode film 12 is low. When the position of the upper surface SU6 of the epitaxial silicon member 121 is set to be low to ensure the breakdown voltage, a distance between a lower end portion of the charge storage film 32 and the lower selection gate line SGS becomes undesirably longer and the threshold voltage of the lower selection gate transistor STS becomes undesirably higher. Also, a distance between a lower end portion of the silicon pillar 20 and the lower selection gate line SGS becomes undesirably longer and the on-current undesirably decreases.

Conversely, according to the second embodiment described above, because the hollow 110 having an acute angle is not formed between the upper surface SU6 of the epitaxial silicon member 121 and the side surface of the memory hole 53, the unoxidized portion 161 of the silicon nitride layer 61 does not remain and the matter described above does not occur.

(Modification of Second Embodiment)

A modification of the second embodiment will now be described.

Figure 22:
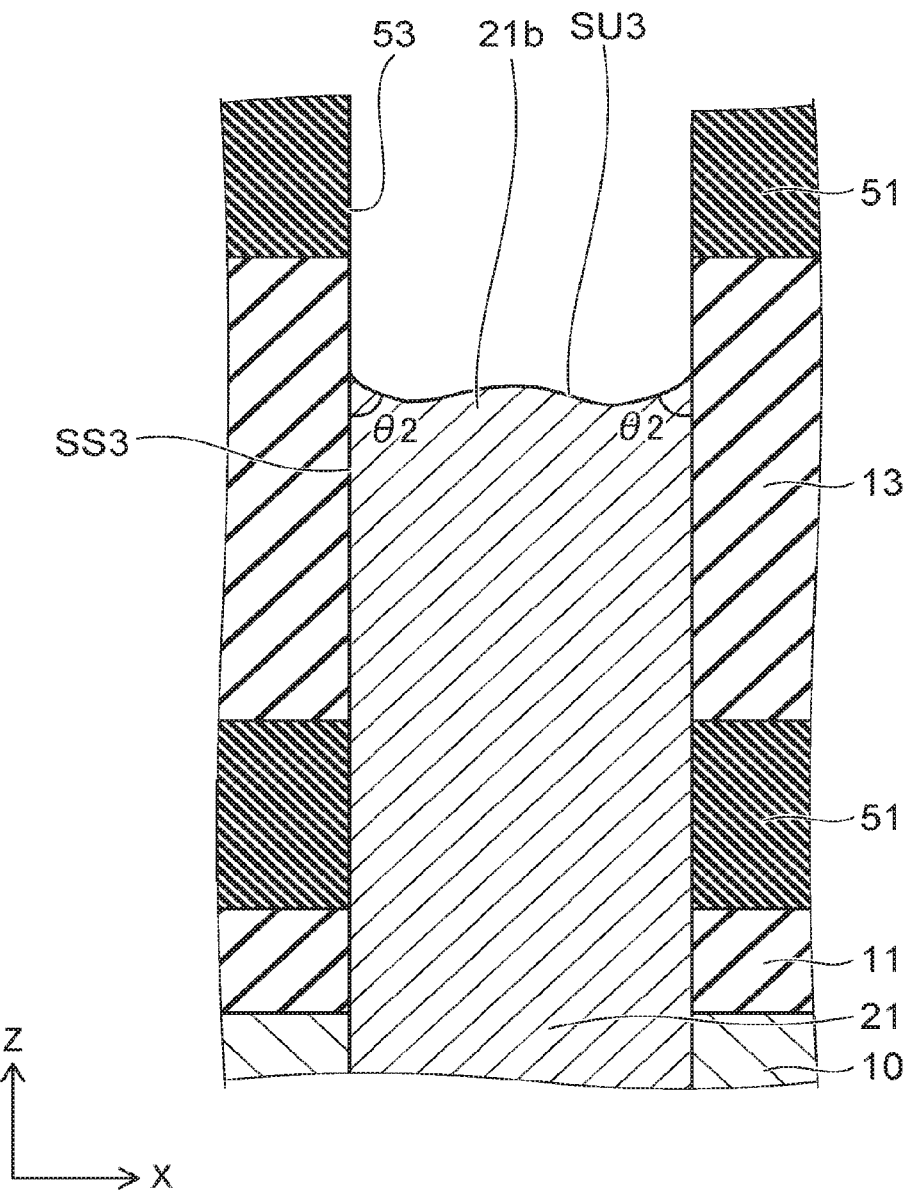
FIG. 22 is a cross-sectional view showing a method for manufacturing a semiconductor memory device according to a modification of the second embodiment.

FIG. 22 is a cross-sectional view showing a method for manufacturing a semiconductor memory device according to the modification.

According to the modification, as shown in FIG. 22, a convex portion 21b is formed in the center portion of an upper surface SU3 of the epitaxial silicon member 21. In such a case as well, if the angle θ2 formed between the upper surface SU3 and the side surface SS3 is an acute angle, effects similar to those of the second embodiment described above can be obtained.

Otherwise, the configuration, the manufacturing method, and the effects of the modification are similar to those of the second embodiment described above.

According to the embodiments described above, a semiconductor memory device having high stability in operation and a method for manufacturing the semiconductor memory device can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor memory device, comprising:
a semiconductor substrate;
a stacked body provided on the semiconductor substrate, the stacked body comprising a plurality of electrode films, the plurality of electrode films being disposed to be separated from each other along a vertical direction;
a first semiconductor member provided inside the stacked body and contacting the semiconductor substrate;
a second semiconductor member provided on the first semiconductor member inside the stacked body, contacting the first semiconductor member and extending in the vertical direction; and
an insulating film provided between the second semiconductor member and the electrode films,
a configuration of a contact surface between the first semiconductor member and the second semiconductor member being convex downward,
the contact surface comprising an inclined region being displaced upward toward an outer side and a flat region surrounded with the inclined region, and
a first angle formed between the upper surface of the semiconductor substrate and the flat region is smaller than a second angle formed between the upper surface of the semiconductor substrate and the inclined region.

2. The device according to claim 1, wherein the second angle is not less than 40° and not more than 70°.

3. The device according to claim 2, wherein the second angle is not less 54° and not more than 55°.

4. The device according to claim 1, wherein a lower portion of the first semiconductor member is disposed inside the semiconductor substrate.

5. The device according to claim 1, wherein a crystal structure of the semiconductor substrate and a crystal structure of the first semiconductor member are continuous.

6. The device of claim 1, wherein an angle formed between an upper surface of the first semiconductor member and a side surface of the first semiconductor member is an acute angle.

7. The device according to claim 6, wherein the flat region is parallel to the upper surface of the semiconductor substrate.

8. The device according to claim 6, wherein a boundary between the inclined region and the flat region forms a ridge line.

* * * * *